US005764498A

United States Patent [19]

Sundstrom

[11] Patent Number: 5,764,498
[45] Date of Patent: Jun. 9, 1998

[54] ELECTRONICS ASSEMBLY FORMED WITH A SLOTTED COUPLING DEVICE THAT ABSORBS MECHANICAL FORCES, SUCH AS VIBRATION AND MECHANICAL SHOCK

[75] Inventor: Lance L. Sundstrom, Pinellas, Fla.

[73] Assignee: Honeywell Inc., Minneapolis, Minn.

[21] Appl. No.: 882,320

[22] Filed: Jun. 25, 1997

[51] Int. Cl.$^6$ .................... F16M 13/00; F16F 15/00
[52] U.S. Cl. .................... 361/809; 361/804; 248/638; 248/570; 267/160; 29/896.93
[58] Field of Search .................... 361/707, 711, 361/712, 718, 719, 720, 721, 775, 799, 804, 809; 439/66, 91, 554; 248/638, 636, 570, 557; 267/160, 158; 29/896.93; 174/70 B, 72 B, 73.1, 75 F, 88 B

[56] References Cited

U.S. PATENT DOCUMENTS

| | | | |
|---|---|---|---|
| 3,951,493 | 4/1976 | Kozel et al. | 439/66 |
| 4,640,499 | 2/1987 | Hemler et al. | 267/160 |
| 4,752,058 | 6/1988 | Weber | 248/638 |
| 5,199,889 | 4/1993 | McDevitt, Jr. | 439/66 |
| 5,259,770 | 11/1993 | Bates et al. | 439/66 |
| 5,308,675 | 5/1994 | Crane et al. | 248/638 |

Primary Examiner—Leo P. Picard
Assistant Examiner—John B. Vigushin
Attorney, Agent, or Firm—Vincent A. Branton

[57] ABSTRACT

An electronics assembly is described which allows three-dimensional movement of a printed wiring board (PWB) relative to an attached electronics subassembly. The subassembly is attached to the PWB by a coupling device which is capable of resilient deflection responsive to mechanical agitation while maintaining effective electrical and thermal communication between the subassembly and the PWB. The coupling device includes contact surfaces which enhance the reliability of the overall electronics assembly by minimizing the potential for detachment of the subassembly from the PWB.

9 Claims, 3 Drawing Sheets

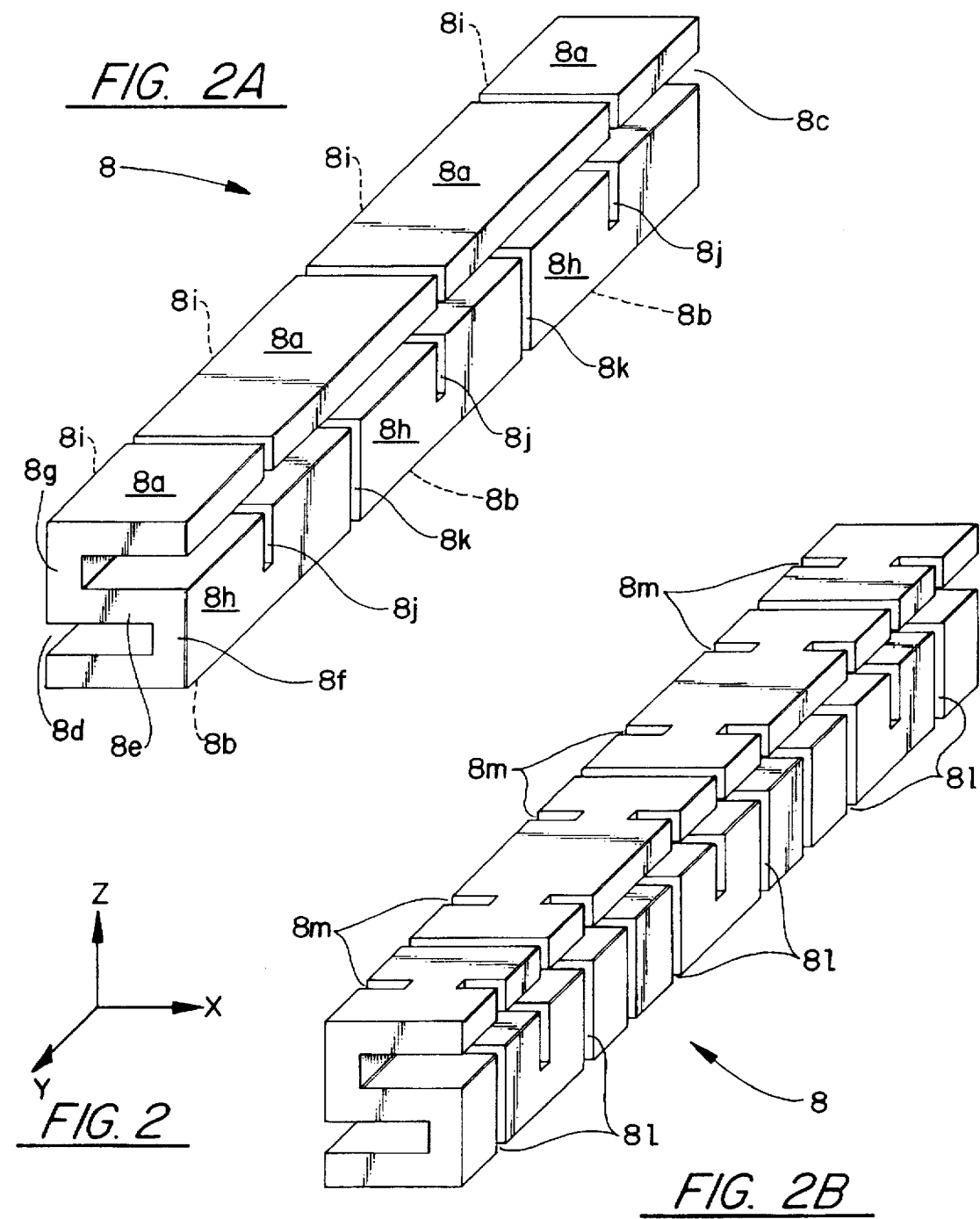

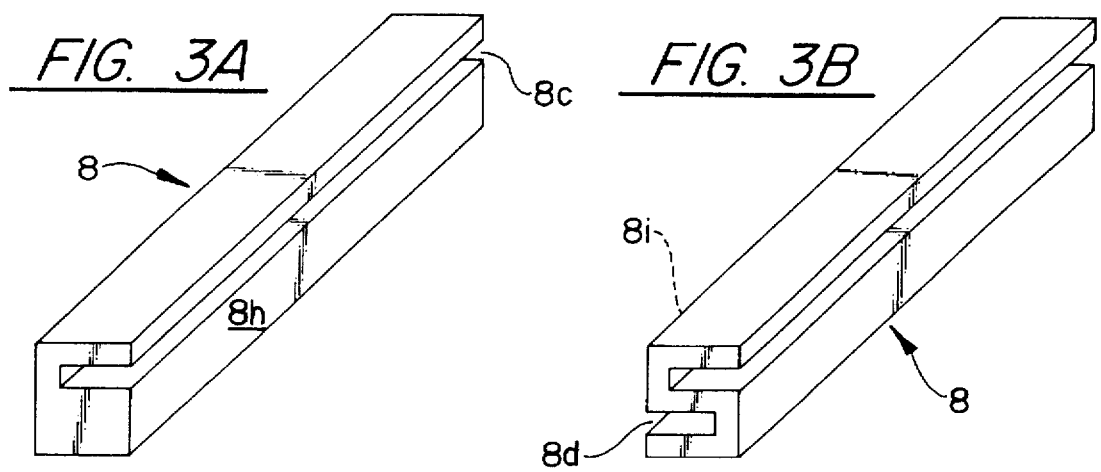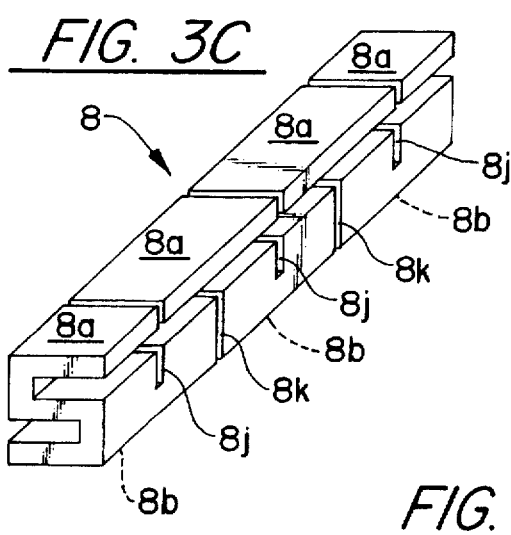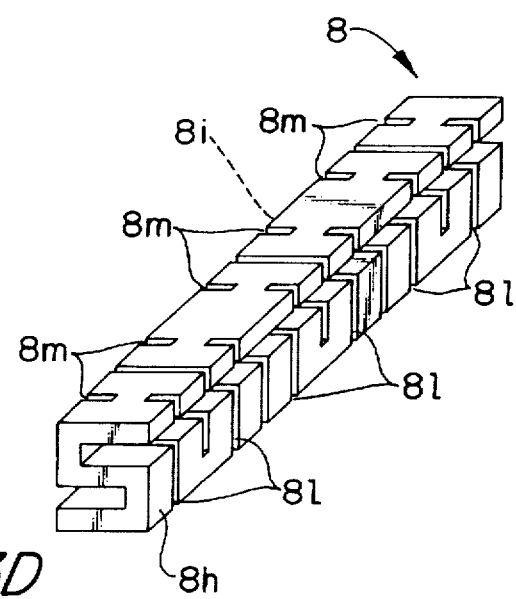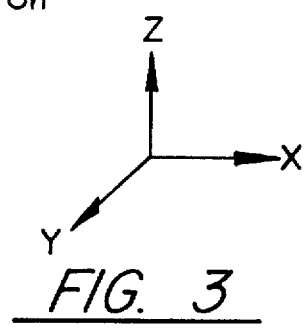

5,764,498

ELECTRONICS ASSEMBLY FORMED WITH A SLOTTED COUPLING DEVICE THAT ABSORBS MECHANICAL FORCES, SUCH AS VIBRATION AND MECHANICAL SHOCK

This invention was made with Government support under contract F29601-95-C-0039 awarded by the U.S. Department of the Air Force to Honeywell, Inc. and the Government has certain rights in this invention.

TECHNICAL FIELD

The present invention relates to electronic assemblies, and more particularly to electronic assemblies having electronic subassemblies which are attached to printed wiring boards (PWBs).

BACKGROUND OF THE INVENTION

Complex electronics assemblies often incorporate electronics subassemblies, such as double sided electronics boards, which are "piggybacked" to PWBs. A typical piggyback configuration has an electronics subassembly, a PWB, and a coupling device which connects the subassembly to the PWB. In many applications, the subassembly and the PWB have a ground plane which is electrically linked through the coupling device.

Modern applications, most notably military and aerospace applications, require that an electronics assembly be capable of surviving extreme mechanical stress while maintaining optimal operational capability throughout the life cycle of the assembly. Mechanical forces, such as vibration and mechanical shock resulting from various sources, are, in general, directly transferred to the electronics assembly through the structure of the apparatus on which the electronics assembly is installed. In turn, the mechanical forces are translated to the assembly's PWBs thereby causing the 5 PWBs to move relative to the piggybacked subassemblies. This relative movement creates compression, tension, stress, and strain forces which are concentrated at the coupling-subassembly and coupling-PWB attachment junctions.

Typical methods for attaching electronic subassemblies to PWBs employ either a clip device or a rigid standoff apparatus to attach the subassembly to the PWB. Generally, these methods permit the subassembly to "ride" the mechanical distortions of the PWB but do not permit mechanical translation of the subassembly relative to the PWB. Because these attachment methods rigidly connect the subassembly to the PWB, the attachment junctions between the apparatus and the subassembly or between the apparatus and the PWB may be overstrained to the point of mechanical failure. In some instances, the mechanical failure may effectively separate the subassembly from the PWB, causing diminished assembly performance or, in the worst case, assembly failure.

DISCLOSURE OF THE INVENTION

It is an object of the present invention to attach an electronics subassembly to a printed wiring board in a manner which firmly supports the subassembly yet is supple enough to absorb incident mechanical forces caused by movement of the PWB relative to the subassembly.

In accordance with one aspect of the present invention, a resilient coupling device joins an electronics subassembly and a PWB. Together, the coupling device, the subassembly, and the PWB form an electronics assembly. The coupling is a continuous metal alloy bar having multiple orthogonal slots. Horizontal slots in the sides of the coupling give the coupling a S-shaped cross-section and allow the coupling to resiliently comply with forces in the x- or z-directions. Vertical slots in the top and bottom of the coupling allow resilient compliance with forces in the y-direction. Additionally, vertical slots in the coupling's front and rear sides may be added to increase the coupling's y-direction compliance capabilities.

Another aspect of the present invention includes making an electronics assembly by joining an electronics subassembly and a PWB with a continuous metal alloy coupling device. Parallel, horizontal slots are cut in a first pair of opposing sides of the coupling and parallel, vertical slots, orthogonal to the horizontal slots, are also cut in another pair of opposing sides of the coupling.

Further objects, benefits, and features of the present invention will become apparent to one of ordinary skill in the art from the drawings and description of the preferred embodiments contained and disclosed herein.

BRIEF DESCRIPTION OF THE DRAWINGS

FIG. 2A is a perspective of the basic resilient coupling device.

FIG. 2B is a perspective of the resilient coupling device including optional opposing vertical slots.

FIG. 3A is a perspective of the resilient coupling device after the first horizontal slot has been cut during the fabrication process.

FIG. 3B is a perspective of the resilient coupling device after the second horizontal slot has been cut during the fabrication process.

FIG. 3C is a perspective of the completed basic resilient coupling device after the vertical slots have been cut.

FIG. 3D is a perspective of the completed resilient coupling device after the optional opposing vertical slots have been cut.

BEST MODE FOR CARRYING OUT THE INVENTION

Figure 1:
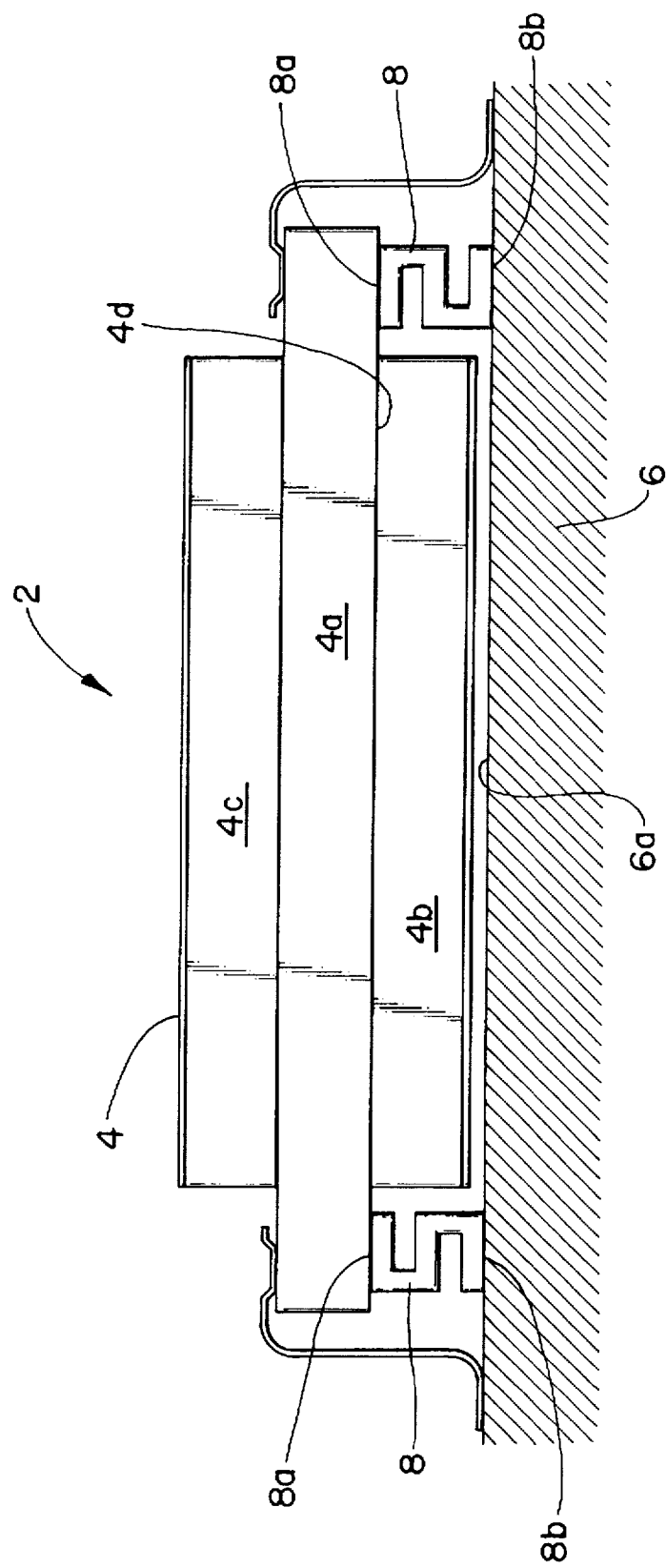
FIG. 1 is an elevation of an electronics assembly having two resilient coupling devices operatively disposed between a PWB and a double-sided electronics board.

Referring to FIG. 1, an electronics assembly 2 is shown having an electronic subassembly 4, a PWB 6, and resilient coupling devices 8. The electronic subassembly 4 is a double-sided electronic subassembly having a body 4a, a lower electronics portion 4b, an upper electronics portion 4c, and a conductive surface 4d. The PWB 6 is also equipped with a conductive surface 6a. The couplings 8 are composed of any electrically and thermally conductive alloy, e.g., copper, beryllium-copper, or copper-tungsten, having mechanical flexure and memory capability. Additionally, the couplings 8 are equipped with a contact surface 8a and a bottom contact surface 8b. The top contact surface 8a is connected to the conductive surface 4d of the body 4a by any commonly known method for joining two electrically conductive materials, e.g., soldering or welding. The bottom contact surface 8b is connected to the conductive surface 6a of the PWB 6 in like manner. Although a double-sided electronics board is used to illustrate an electronics subassembly 4 joined to a PWB 6 in accordance with the invention, one of ordinary skill in the art will realize that the coupling 8 can be used to attach other types of electronics subassemblies to PWBs.

Referring to FIG. 2A, the coupling 8 has two horizontal, longitudinal slots 8c and 8d which extend along the coupling's 8 entire length and penetrate greater than 50% of the coupling's 8 width. The depth of the horizontal slots 8c and 8d is selected to allow the coupling 8 to deflect in the x- and z-directions without permanently deforming the coupling 8. The horizontal slots 8c and 8d give the coupling 8 a S-shaped, y-axis cross-section and define a spring member 8e. The spring member 8e gives the coupling 8 spring-like response characteristics to z-axis forces created by the movement of the PWB 6 relative to the subassembly 4. The horizontal slots 8c and 8d also define two vertical leg members 8f and 8g which border the front side 8h and the rear side 8i of the coupling 8, respectively. The leg members 8f and 8g give the coupling 8 spring-like response characteristics to x-axis forces created by the movement of the PWB 6 relative to the subassembly 4. The coupling 8 also has vertical slots 8j which bound the top contact surfaces 8a and vertical slots 8k which bound the bottom contact surfaces 8b. The vertical slots 8j and 8k penetrate greater than 50% of the coupling's 8 height. The depth of the vertical slots 8j and 8k is selected to allow the coupling 8 to deflect in the y-direction without permanently deforming the coupling 8. The vertical slots 8j and 8k also give the coupling 8 spring-like response characteristics to y-axis forces created by the movement of the PWB 6 relative to the subassembly 4.

Referring to FIG. 2B, the coupling's 8 front and rear sides 8h and 8i may include opposing vertical slots 8l and 8m to increase the y-axis deflection limits of the coupling 8. To allow for predictable, uniform deflection of the coupling 8, the opposing vertical slots 8l and 8m are oriented in the same x-z plane and are located between, preferably midway between, the vertical slots 8j and 8k. Each of the opposing vertical slots 8l and 8m extend along the entire height of the coupling 8 but penetrate less than 50% of the width of the coupling 8. The depth of the opposing vertical slots 8l and 8m is selected to allow the coupling 8 to deflect without permanently deforming the coupling 8.

The coupling 8 gives the electronics assembly 2 the optimum balance of rigidity, mechanical compliance, and resiliency necessary to reliably attach the electronics subassembly 4 to the PWB 6. The following equations may be helpful in the selection of the various slot dimensions. Assuming worst case acceleration, mechanical shock, or vibrational stimulus, the product of the minimum block deflection force, $F_{B(min)}$, and the total number of blocks in coupling 8, $n_B$, (a block is defined as the portion of the coupling 8 bounded by the vertical slots 8j and 8k) must exceed the maximum net force on the electronics assembly 2, $F_{EA(max)}$.

$$F_{B(min)} n_B > F_{EA(max)} \qquad \text{Eq. 1}$$

The minimum block deflection force is the minimum force necessary to deflect each block from its relaxed position. Additionally, the maximum block deflection force, the force at the junctions between the conductive surfaces 4d, 6a and the contact surfaces 8i, 8b, respectively, at maximum block deflection, $F_{BA(max)}$, must not exceed the maximum safe stress levels at the respective junctions, $S_{J(max)}$, for the joining method used, e.g., soldering.

$$F_{BA(max)} \leq S_{J(max)} \qquad \text{Eq. 2}$$

Referring to FIG. 3A, the coupling 8 is formed from a contiguous piece of metal alloy. Using conventional machining techniques, a first horizontal slot 8c is cut in the front side 8h of the coupling 8. Referring to FIG. 3B, a second horizontal slot 8d is cut in the rear side 8i of the coupling 8.

The horizontal slots 8c and 8d are cut on opposite sides of the coupling's 8 longitudinal axis to yield a S-shaped, y-axis cross-section. Referring to FIG. 3C, the top contact surfaces 8a are bouned by the vertical slots 8j which are cut in the top side of the coupling 8. The bottom contact surfaces 8b are bounded by the vertical slots 8k which are cut in the bottom side of the coupling 8. The vertical slots 8j and 8k may be repeatedly cut along the length of the coupling 8, preferably in uniform intervals, to create a desired degree of y-axis compliance. Referring to FIG. 3D, optional opposed vertical slots 8l and 8m may be cut in the front side 8h and the rear side 8i of the coupling 8 to increase the coupling's 8 y-axis deflection capabilities.

With the benefit of the previous discussion of the invention, one of ordinary skill in the art may be able to modify the invention, and the functions and functional elements described above, in whole or in part without departing from the true scope and spirit of the invention.

I claim:

1. An electronics assembly comprising a printed wiring board having a first conductive surface, an electronics subassembly having a second conductive surface, and a coupling device having upper and lower contact surfaces, the lower contact surface being connected with the first conductive surface of the printed wiring board, the upper contact surface being connected with the second conductive surface of the electronics subassembly, the electronics package characterized in that the coupling device comprises:

a resilient bar having a longitudinal axis, first and second parallel sides, and third and fourth parallel sides orthogonal to the first and second parallel sides, the first and second parallel sides defining the upper and lower contact surfaces;

a first horizontal slot in the third parallel side;

a second horizontal slot in the fourth parallel side, the first and second horizontal slots giving the coupling device a S-shaped cross-section;

a first vertical slot in the first parallel side; and a second vertical slot in the second parallel side and laterally offset relative to the first vertical slot.

2. An electronics assembly as described in claim 1 further characterized in that the first and second horizontal slots extend along the entire length of the resilient bar.

3. An electronics assembly as described in claim 2 further characterized in that the first and second horizontal slots penetrate between 50% and 100% of the width of the resilient bar.

4. An electronics assembly as described in claim 3 further characterized in that first and second vertical slots penetrate between 50% and 100% of the height of the resilient bar.

5. An electronics assembly as described in claim 4 further characterized in that the resilient bar comprises:

a pair of vertical opposing slots, one of the vertical opposing slots in the third parallel side, the other vertical opposing slot in the fourth parallel side, the vertical opposing slots being oriented in a common plane and located between the first and second vertical slots.

6. An electronics assembly as described in claim 5 further characterized in that each of the vertical opposing slots penetrates less than 50% of the width of the resilient bar.

7. An electronics assembly as described in claim 1 further characterized in that the resilient bar is made of an electrically and thermally conductive metal alloy.

8. A method for constructing an electronics assembly comprising: attaching a first conductive surface of a printed wiring board to a first contact surface of a coupling device and attaching a second conductive surface of an electronics subassembly to a second contact surface on the coupling device, characterized by:

providing a mechanically compliant, electrically and thermally conductive rod having a longitudinal axis, first and second parallel sides, and third and fourth parallel sides orthogonal to the first and second parallel sides, the first and second parallel sides defining the first and second contact surfaces;

cutting a first horizontal slot in the third parallel side;

cutting a second horizontal slot in the fourth parallel side such that the first and second horizontal slots give the mechanically compliant rod a S-shaped cross-section;

cutting a first vertical slot in the first parallel side; and cutting a second vertical slot in the second parallel side, the second vertical slot being laterally offset relative to the first vertical slot.

9. The method for constructing an electronics assembly as described in claim 8 further characterized by: cutting a pair of vertical opposing slots, one of the vertical opposing slots being cut in the third parallel side, the other vertical opposing slot being cut in the fourth parallel side, the vertical opposing slots oriented in a common plane and located between the first and second vertical slots.

* * * * *